United States Patent
Dorrough

(10) Patent No.: US 11,921,143 B2
(45) Date of Patent: Mar. 5, 2024

(54) APPARATUS, METHODS, AND TECHNIQUES OF DISPLAY FOR OBSCURED FEATURE DETECTION WITH LIVE WIRE DETECTION

(71) Applicant: Franklin Sensors Inc., Meridian, ID (US)

(72) Inventor: David M. Dorrough, Eagle, ID (US)

(73) Assignee: Franklin Sensors Inc., Meridian, ID (US)

( * ) Notice: Subject to any disclaimer, the term of this patent is extended or adjusted under 35 U.S.C. 154(b) by 0 days.

(21) Appl. No.: 17/831,247

(22) Filed: Jun. 2, 2022

(65) Prior Publication Data

US 2023/0393183 A1    Dec. 7, 2023

(51) Int. Cl.
*G01R 29/08*    (2006.01)

(52) U.S. Cl.
CPC ................ *G01R 29/0892* (2013.01)

(58) Field of Classification Search
CPC .................................................. G01R 29/0892
USPC ........................................................ 324/457
See application file for complete search history.

(56) References Cited

U.S. PATENT DOCUMENTS

| | | | | |
|---|---|---|---|---|
| 4,388,589 A * | 6/1983 | Molldrem, Jr. | ...... | G01R 13/404 340/815.45 |
| 4,464,622 A * | 8/1984 | Franklin | ................ | G01V 3/088 324/67 |
| 4,825,150 A * | 4/1989 | Sirasud | ................. | G01R 31/54 324/133 |
| 5,119,019 A * | 6/1992 | George | .................. | G01R 15/08 702/65 |
| 5,122,733 A * | 6/1992 | Havel | .................. | G01R 13/405 345/83 |
| 5,477,133 A * | 12/1995 | Earle | ...................... | G01R 31/54 340/407.1 |
| 7,013,570 B2 * | 3/2006 | Levine | ..................... | G01V 3/15 324/67 |
| 7,102,366 B2 * | 9/2006 | Denen | ................ | A47K 10/3687 324/662 |
| 7,495,455 B2 * | 2/2009 | Sanoner | ............... | G01R 29/085 324/67 |
| 7,642,730 B2 * | 1/2010 | Dowling | ................ | H05B 47/17 362/372 |
| 8,274,273 B2 * | 9/2012 | Nguyen | .............. | H01M 10/488 324/126 |
| 8,593,163 B2 * | 11/2013 | Dorrough | .............. | G01V 3/088 324/67 |
| 8,669,772 B2 * | 3/2014 | Dorrough | .......... | G01R 27/2605 324/67 |
| 9,664,808 B2 * | 5/2017 | Nguyen | .............. | H01M 10/052 |
| 10,209,357 B2 * | 2/2019 | Rhead | ...................... | G01S 7/24 |

(Continued)

*Primary Examiner* — Christopher P McAndrew
(74) *Attorney, Agent, or Firm* — Foley & Lardner LLP

(57) ABSTRACT

Obscured feature detectors are disclosed that have both the capability to sense the location of obscured structural features and the ability to warn a user of obscured live electrical wires in the vicinity. Apparatus, devices, and methods to detect a presence of hidden or obscured objects or features behind opaque, solid surfaces are disclosed. Beams, studs and columns behind walls and joists beneath floors can be located. Also, a presence of an electrical field strength associated with live wires behind walls and beneath floors can be detected. The location of obscured features and the electric field strength can be displayed simultaneously.

19 Claims, 11 Drawing Sheets

(56) References Cited

U.S. PATENT DOCUMENTS

| | | | |
|---|---|---|---|
| 10,564,116 B2 * | 2/2020 | Rhead | G01V 3/08 |
| 10,571,423 B2 * | 2/2020 | Eidinger | G01V 3/15 |
| 10,571,591 B2 * | 2/2020 | Rhead | G01V 3/08 |
| 10,585,203 B2 * | 3/2020 | Rhead | G01N 27/00 |

\* cited by examiner

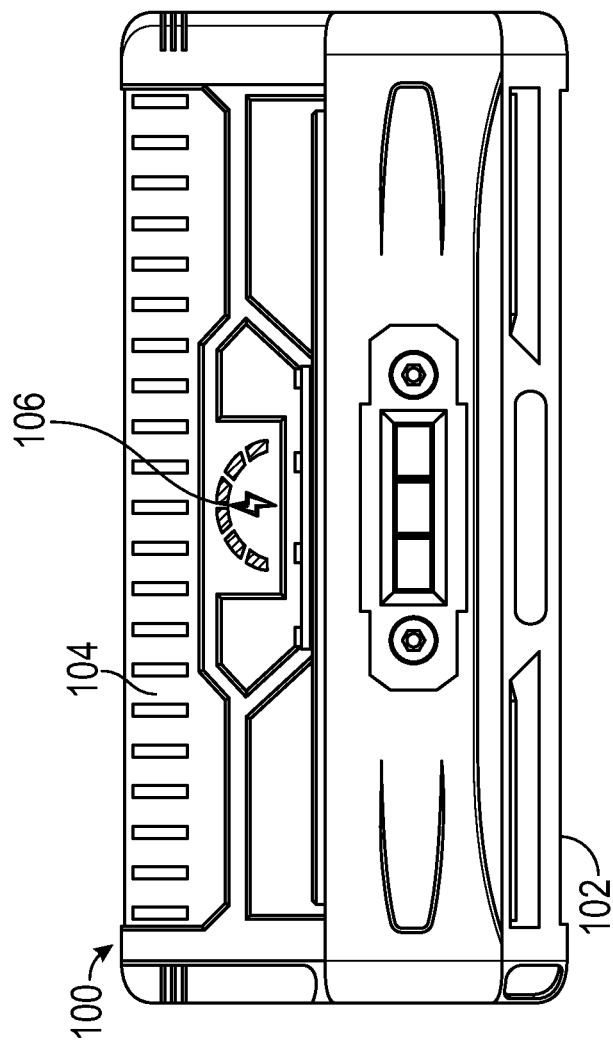
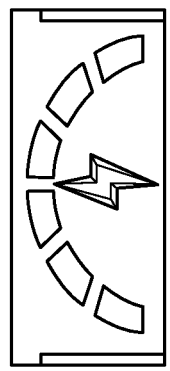
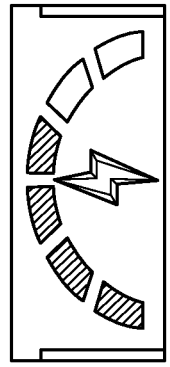
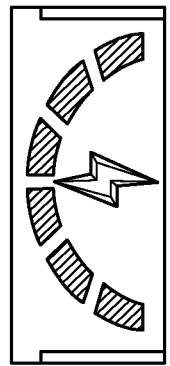
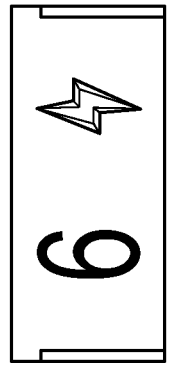

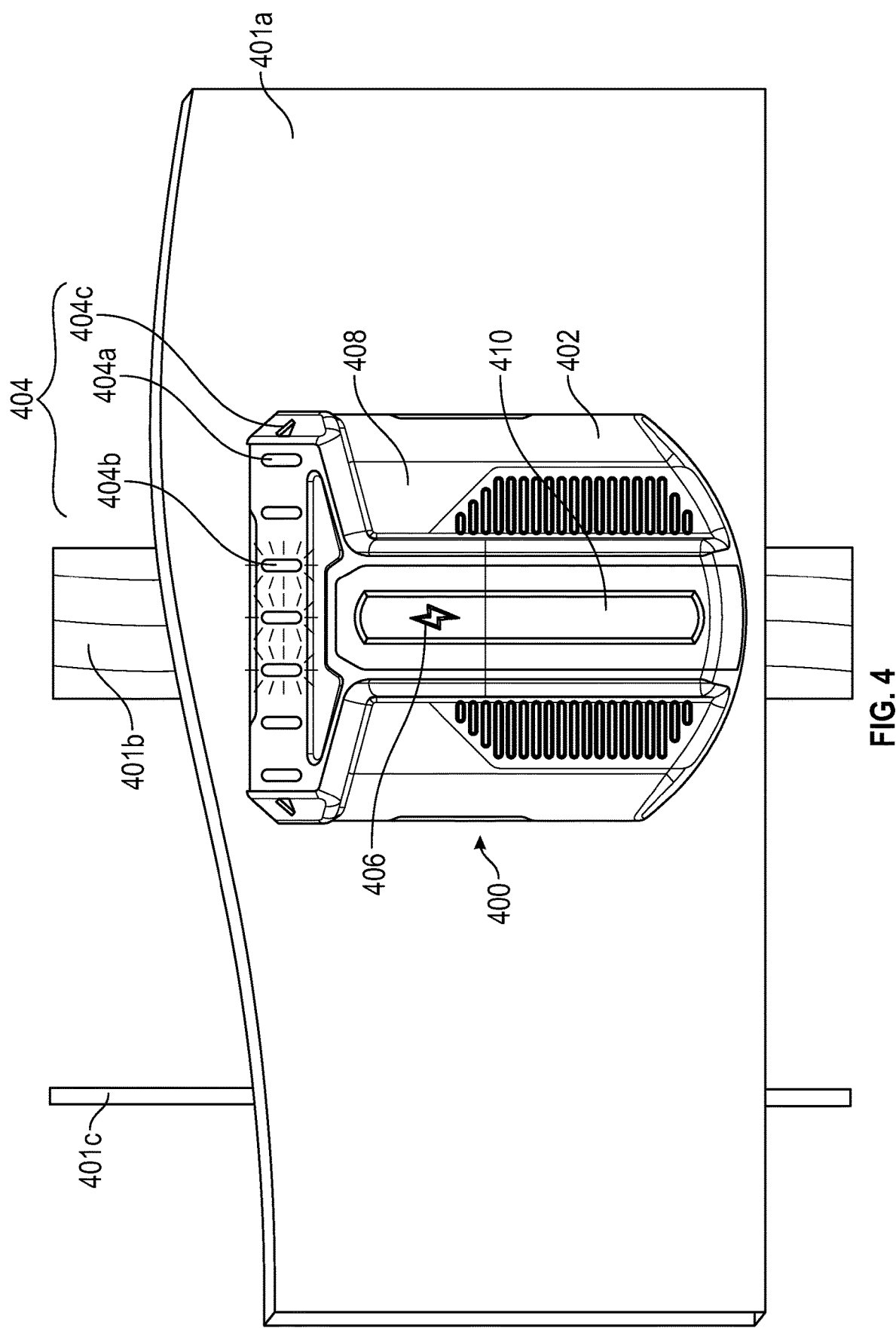

APPARATUS, METHODS, AND TECHNIQUES OF DISPLAY FOR OBSCURED FEATURE DETECTION WITH LIVE WIRE DETECTION

TECHNICAL FIELD

The present disclosure relates to obscured feature detectors that have both the capability to sense the location of obscured features (e.g., behind walls and beneath floors) and the ability to warn the user if live electrical wires are in the vicinity.

BACKGROUND

Locating obscured features such as beams, studs, joists, and other elements behind walls and beneath floors is a common problem encountered during construction, repair, and home improvement activities. Cutting or drilling into a wall, floor, or other supported surface to create an opening in the surface, while avoiding the underlying support elements, is a regular occurrence. Knowing where the support elements are positioned before beginning can be desirable so as to avoid cutting or drilling into the support elements. Anchoring a heavy object such as a picture, cabinet, or shelf to a support element obscured by a supported surface is also a common occurrence. In these cases, it is often desirable to install a fastener through the supported surface in alignment with an underlying support element. However, with the wall, floor or supported surface in place, the location of the support element is not visually detectable.

Obscured feature detectors with electronic sensors have also been developed to detect obscured features behind opaque surfaces. These detectors sense changes in capacitance on the examined surface that result from the presence of features positioned behind, beneath or within the surface. These changes in capacitance are detectable through a variety of surfaces such as wood, sheetrock, plaster, and gypsum and do not rely on the presence of metal fasteners in the surface or obscured feature for activation of the sensor.

Simply detecting obscured structural features has limitations. Electrical wires can also be obscured behind an opaque surface. The electrical wires may not be near a support structure and regardless of location it may be desirable to avoid electrical wires, particularly if the wires are live.

Presently available obscured feature detectors with dual sensing capability exist to detect both obscured features and live electrical wires. The presently available obscured feature detectors use a live wire sensing element that is left electrically floating and is sensed. As a result, the live wire sensing element's voltage level oscillates in the presence of live electrical wire, though at a substantially lower voltage. An amplifier may be used to increase the signal strength of the sensed live wire sensing element. Further, these presently available obscured feature detectors continually sense the live wire sensing element and an algorithm facilitates determining whether to activate a warning signal to the user to warn that a live wire may be in vicinity. While the live wire sensing element is sensing (e.g., detecting an electrical field formed between the live wire sensing element and a live electrical wire), a separate set of circuitry and a separate set of sensor pads sense for the presence of obscured features (e.g., sense for electrical field formed between the obscured feature sensing pads and ground or reference). As a result, there is one set of circuitry for sensing of the live wires, and a separate set for sensing for the obscured features. Multiple sources of electrical fields may interfere with accurate obscured feature sensing. Stated differently, these presently available obscured feature detectors include distinct modes and mechanisms of sensing live electrical wires and sensing other obscured features, albeit packaged in a single product.

SUMMARY

The present disclosure is directed to apparatus, methods, and generally to devices to detect a presence of hidden or obscured objects or features behind opaque, solid surfaces, and more specifically to devices to locate beams, studs and columns behind walls and joists beneath floors and also to detect a presence of the electrical field strength associated with live electrical wires behind walls and beneath floors, and to display the location of obscured features and display the electric field strength simultaneously.

Additional aspects and advantages will be apparent from the following detailed description of preferred embodiments, which proceeds with reference to the accompanying drawings.

BRIEF DESCRIPTION OF THE DRAWINGS

FIG. 1A is a top view of an obscured feature detector, according to one embodiment of the present disclosure.

FIG. 1B shows a live wire indicator that displays to the user a variable electrical field strength of a detected live electrical wire.

FIG. 1C shows a live wire indicator that displays to the user a variable electrical field strength of a detected live electrical wire.

FIG. 1D shows a live wire indicator that displays to the user a variable electrical field strength of a detected live electrical wire.

FIG. 1E shows a live wire indicator that displays a number on a numerical scale to display the variable electrical field strength of the detected live electrical wire.

FIG. 4 illustrates an obscured feature detector, according to another embodiment of the present disclosure.

DETAILED DESCRIPTION OF PREFERRED EMBODIMENTS

Figure 2:
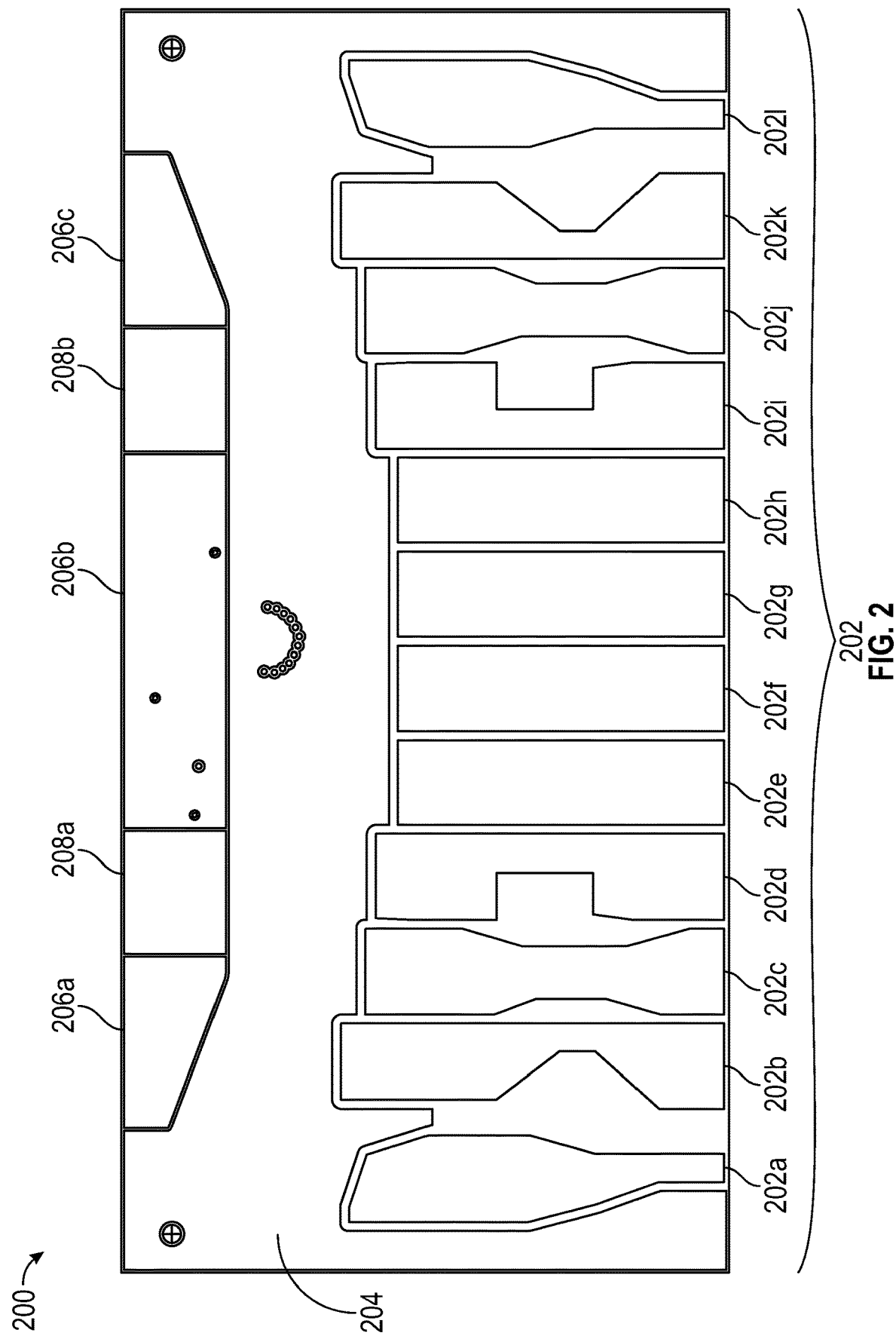
FIG. 2 is a diagram of a bottom layer of a circuit board of an obscured feature detector, according to one embodiment of the present disclosure.

The present disclosure relates generally to devices to detect a presence of hidden or obscured objects or features behind opaque, solid surfaces, and more specifically to devices to locate beams, studs and columns behind walls and joists beneath floors and also to locate electrical wires behind walls and beneath floors.

Obscured feature detectors with dual sensing capability exist. These presently available dual-sensing obscured feature detectors use a live wire sensing element that is left electrically floating, and is sensed. As a result, a voltage level of the live wire sensing element oscillates in the presence of live electrical wire. For example, in the United States house wiring is commonly 120V, 60 Hz. Therefore, if the floating live wire sensing element is in the presence of a live electrical wire, it will also oscillate at 60 Hz. However, it will oscillate with a voltage will likely be substantially less than 120V. These presently available obscured feature detectors commonly apply an amplifier to increase the signal strength of the sensed live wire sensing element. The prior art obscured feature detectors continually sense the live wire sensing element. An algorithm may then determine whether to activate a warning signal to the user to warn that a live wire may be within a near vicinity. Concurrent with the live wire sensing element being sensed, a separate set of circuitry and separate set of sensor pads sense for the presence of obscured features. As a result, there is one set of circuitry for sensing of the live wires, and a separate set for sensing of the obscured features. This form of separate yet dual sensing has been commonly used in presently available obscured feature products.

A shortcoming of the prior art obscured feature detectors (sometimes also known as stud finders) is that the live wire sensing element can interfere with the sensing of obscured features. As the floating live wire sensing element oscillates it can interfere with the sensing of obscured features. Electrical fields formed by a live electrical wire and the floating live wire sensing element may impair accurate sensing of electrical fields generated for detection of obscured features. This problem becomes more pronounced with higher accuracy obscured feature detectors that have more sensor pads.

An embodiment of the present disclosure achieves higher accuracy obscured feature sensing and maintains the capability to warn the user if a live wire is present. It achieves higher accuracy sensing of obscured features, and at a very low cost.

The presently disclosed embodiments may achieve this result by interleaving the sensing of obscured features and live wires. For example, a multiplexer (MUX) may be used to couple a live wire sensing element to either sensing circuitry, or to a reference such as ground or an active shield. This interleaving can allow the live wire sensing element to float, while being sensed. The sensed signal may be amplified, such as by an op-amp, to make the signal more useable for communicating information to the user. For example, the amplified signal may be fed into an analog to digital converter (ADC). In some embodiments the ADC may be built into a microcontroller. In some embodiments it may be advantageous to only sense for about 2 cycles of the 60 Hz signal, which equates to about 33 milliseconds. By limiting the sensing time, it may be possible to make an obscured feature detector that is more responsive. Two cycles may be enough in some embodiments to identify that the signal is a 50 Hz or 60 Hz signal. In some embodiments the readings of the ADC will be recorded first, then processed second. In some embodiments, 100 samples taken over a period of about 33 milliseconds may be sufficient.

In some embodiments it may be advantageous to process the reading to determine if the reading comes primarily from a 50 Hz or 60 Hz source. If the signal seems to have a frequency that is approximately 50 Hz or 60 Hz it would indicate that it likely came from a live wire, rather than from a spurious source, and make it possible to more accurately predict if the readings came from a live wire. Therefore, in some embodiments it may be advantageous to employ digital filtering techniques to determine if the reading is primarily from a 50 Hz or 60 Hz source. There are many known techniques that can accomplish this that may be employed by those skilled in the art. Some of the techniques may include pattern matching the readings against predetermined wave shapes, or using digital low-pass and high pass filters to create band-pass filters to remove all but the 50 Hz or 60 Hz component, or other techniques.

After the live wire sensing is complete, the MUX may be switched to couple the live wire sensing element to a reference signal such as ground, or to active shield, or to another known reference signal.

Once the MUX couples the live wire sensing element to a known reference, then the sensing of the obscured features may take place. In some embodiments, digital processing of previously stored readings from the live wire sensing may take place simultaneously or otherwise concurrently with the sensing of obscured features. Likewise digital processing of the obscured feature detector readings may take place during the live wire sensing.

The obscured feature detector may include a sensing element with one or more sensing pads. When the sensing element is positioned on a surface at a location with no obscured feature behind the surface, the obscured feature detector measures the capacitance of the surface and the air behind the surface. When the sensing element is moved into a position having an obscured feature behind the surface, the apparatus 100 then measures the capacitance of the surface and the obscured feature, which has a higher dielectric constant than air. Accordingly, the obscured feature detector registers an increase in capacitance, which can then be used to trigger a feedback system, such as a proximity indicator display, to alert the user that an obscured feature has been detected behind the surface.

Additional background on sensing obscured features, may be obtained with reference to the following U.S. Pat. Nos. 8,476,912, 8,593,163, 8,669,772, 8,736,283, 8,791,708, 8,836,347, 8,884,633, 10,261,208, 10,613,243, 10,663,613, which may include additional information pertinent to the obscured feature detection disclosed herein.

Once the sensing of the obscured features is complete, then the MUX may be switched back such that the electrical wire sensing circuitry is once again coupled to the live wire sensing element.

Other functions and features can also be included in the disclosed obscured feature detector embodiments. For example, enhancements to the display can be included and the display can be updated to let the user know what has been sensed. The display may be updated between any step, or possibly between every step, and in some embodiments updating the display may only happen after a predetermined number of cycles has completed.

When obscured features are being detected, the live wire sensing element is coupled to a reference. In some embodiments the reference may be ground. In some embodiments the reference may be an active shield. In other embodiments it may be coupled to a different reference signal. It some embodiments it may be advantageous to make the reference be similar to the surroundings of the live wire sensing element. For example, if the live wire sensing element is surrounded by ground, it may be advantageous to make the reference ground. Likewise, if the live wire sensing element is surrounded by active shield it may be advantageous to make the reference to active shield. In some embodiments this will allow all of the sensor pads to have a more similar response and increase the ability to sense obscured features accurately.

A handheld apparatus for detection of obscured features and obscured live wires is used by scanning along a surface, such as a wall, with the apparatus which will provide feedback to a user in real time, typically by an audible or visible alarm, when an obscured feature or live wire is detected in the vicinity. The obscured feature detected by such devices may be an obstruction, like wood or metal studs, and can aid the user to determine a location to safely drill, nail, screw, dig, or the like.

FIG. 1A is a top view of an apparatus 100 for detection of obscured features and obscured live electrical wires, according to one embodiment. The apparatus 100 comprises a housing 102 that houses or otherwise supports indicator displays to visually alert a user when an obscured feature or live wire is detected. The housing 102 also includes sensing elements to sense location of an obscured feature or live electrical wire. The housing 102 may be in a shape, such as a rectangular shape, to support obscured feature sensing elements arranged in a linear configuration on a circuit board of the apparatus for scanning an obscured surface. The apparatus 100 may include one or more types of indicators such as, for example, a proximity indicator display 104 to alert a user that an obscured feature is in the vicinity and a live wire indicator display 106 to alert the user that live wires are sensed nearby. The live wire indicator display 106 is configured to display (e.g., to a user) visual indicia of a variable electrical field strength of a detected live electrical wire. The visual indicia may be varied or changed to display the variability of the electrical field strength of the detected live electrical wire.

In some embodiments, the proximity indicator display 104 may include a visual indicator such as one or more illuminating elements (e.g., light, light emitting diode (LED)). A proximity indicator display 104 may include a plurality of visual indicators arranged in an array. One or more of the visual indicators (of the plurality of visual indicators) may be activated to indicate detection of an obscured feature. In some embodiments, a sensing element may include a plurality of pads, as will be described in greater detail below, and visual indicator may correspond to a sensor pad, such that a measured reading on a sensor pad that indicates detection of an obscured feature results in activation of one or more corresponding visual indicators of the proximity indicator display. In some embodiments, a proximity indicator may include an alarm or other audio device to provide an audible alert to a user. In FIG. 1A, the apparatus 100 includes a proximity indicator display 104 that includes an array of LEDs extending along a length of the apparatus 100. As an obscured feature is detected, one or more of the LEDs is activated to indicate a location of the obscured feature along a length of the apparatus 104, providing clarity as to a location of where the obscured feature is positioned and where the obscured feature is not.

As shown in the illustrated embodiment, the live wire indicator display 106 may include one or more visual indicators, such as one or more illuminating elements (e.g., a light, LED). In some embodiments, a live wire indicator may include an alarm or other audio device to provide an audible alert to a user.

FIG. 1B-1D illustrate the live wire indicator display 106 that includes a plurality of illuminating elements 107 to incrementally display the variable electrical field strength of an obscured live electrical wire (e.g., detected live electrical wire). As discussed below, live wire sensing elements detect the variable electrical field strength of the detected live electrical wire. The detected electrical field strength of the detected live electrical wire is variable because the strength is dependent on how close the live wire sensing elements are to the obscured live electrical wire. In other words, if the live wire sensing elements are close to the obscured live electrical wire, the electrical field strength is stronger than if the live wire sensing elements are further away form the obscured live electrical wire.

In the illustrated embodiment, the live wire indicator display 106 includes six illuminating elements 107. However, the current disclosure is not so limited, and the live wire indicator display 106 may include more or less than six illuminating elements 107. The number of illuminating elements 107 that are illuminated corresponds to the electrical field strength of the detected live electrical wire.

For example, FIG. 1B illustrates zero of the six illuminating elements 107 illuminated signifying that the live wire sensing elements do not detect a live electrical wire. FIG. 1C illustrates four of the six illuminating elements 107 illuminated signifying that the live wire sensing elements detected a live electrical wire and is relatively close to the location of the live electrical wire. FIG. 1D illustrate all six of the illuminating elements 107 illuminated signifying that the live wire sensing elements detected a live electrical wire and is close to the location of the live electrical wire. In other words, the electrical field strength of the live electrical wire increases the closer the live wire sensing elements are to the live electrical wire. The number of illuminating elements 107 illuminate incrementally to show the increase in the detected electrical field strength of the detected live electrical wire. Therefore, a larger number of illuminated illuminating elements indicates a stronger electrical field strength of the detected live electrical wire than a smaller number of illuminated illuminating elements.

In some embodiments, the live wire indicator displays a number on a numerical scale to display the variable electrical field strength of the detected live electrical wire. For example, FIG. 1E illustrates a live wire indicator displaying the number six on a numerical scale of 0-10, which corresponds to the detected electrical field strength of the detected live electrical wire. Zero corresponds to the live wire sensing elements not detecting a live electrical wire and ten corresponds to the live wire sensing elements detecting a live electrical wire close to the live electrical wire. Other numerical scales may be used other than 0-10.

FIG. 2 is a diagram of a bottom layer of a circuit board 200 in an apparatus for detection of obscured features and obscured live electrical wires, according to one embodiment of the present disclosure. The circuit board 200 can be included in the apparatus 100 of FIG. 1A. The circuit board 200 includes an obscured feature sensing element 202 that comprises a plurality of sensing pads 202a-202l that are used to sense presence of an obscured feature in the vicinity when scanning a surface. The obscured feature sensing element 202 performs a sensor reading of a surface to detect obscured features. The sensing element 202, collects sensor readings from each sensing pad 202a-202l, compares the readings, and the one or more sensing pads with the highest readings are interpreted to be near the location of an obscured feature. When the obscured feature sensing pads 202a-202l are placed on a surface at a location with no obscured feature behind the surface, the apparatus 100 measures the capacitance of the surface and the air behind the surface. When the sensing pads 202a-202l are moved into a position having an obscured feature behind the surface, the apparatus 100 then measures the capacitance of the surface and the obscured feature, which has a higher dielectric constant than air. Consequently, the apparatus 100 registers an increase in capacitance, which can then be used to trigger a feedback system, such as a proximity indicator display (e.g., the display 104 of FIG. 1A), to alert the user that an obscured feature has been detected behind the surface.

The obscured feature sensing element 202 is configured to form a first end of an electric field and to take a sensor reading of the electric field, in which the electric field varies based on proximity of the sensor element to surrounding objects and on material property of each of the surrounding objects. In FIG. 2, the obscured feature sensing element 202 includes a plurality of sensor pads 202a-202l arranged linearly. Each of the sensor pads 202a-202l are configured to form a first end of a respective corresponding electric field and to take a sensor reading of the corresponding electric field. The sensor pads 202a-202l may have a rectangular shape, a symmetric shape, an asymmetric shape, an irregular shape, or another complex-geometry shape, to produce a uniform sensor field among a group of sensor pads. The shapes may be formed so that a similar signal response in each sensor pad is produced. The circuit board 200 includes a common plate 204 to form a second end of the corresponding electric field of the obscured feature sensing element. The common plate 204 may be an active shield plate 204 which may be driven as an active shield. The active shield may be driven by the same signal as sensor pads 202a-202l. The bottom layer of circuit board 200 also include ground plates 206a-206c. The ground plates 206a-206c may be connected to the circuit ground.

For detection of live electrical wires, the bottom layer of circuit board 200 further includes live wire sensing elements 208a and 208b for detection of live wires in the vicinity. Live wire sensing elements 208a and 208b may be either coupled to a reference such as the ground plates 206a, 206b, 206c or the active shield 204 when the apparatus is detecting obscured features, or the live wire sensing elements 208a and 208b may be left floating to detect the presence of live electrical wires. The live wire sensing elements 208a and 208b can be positioned adjacent to and between a plurality of ground plates 206a, 206b, 206c. The mechanism of how live wires are detected is explained later in this disclosure.

Figure 3:
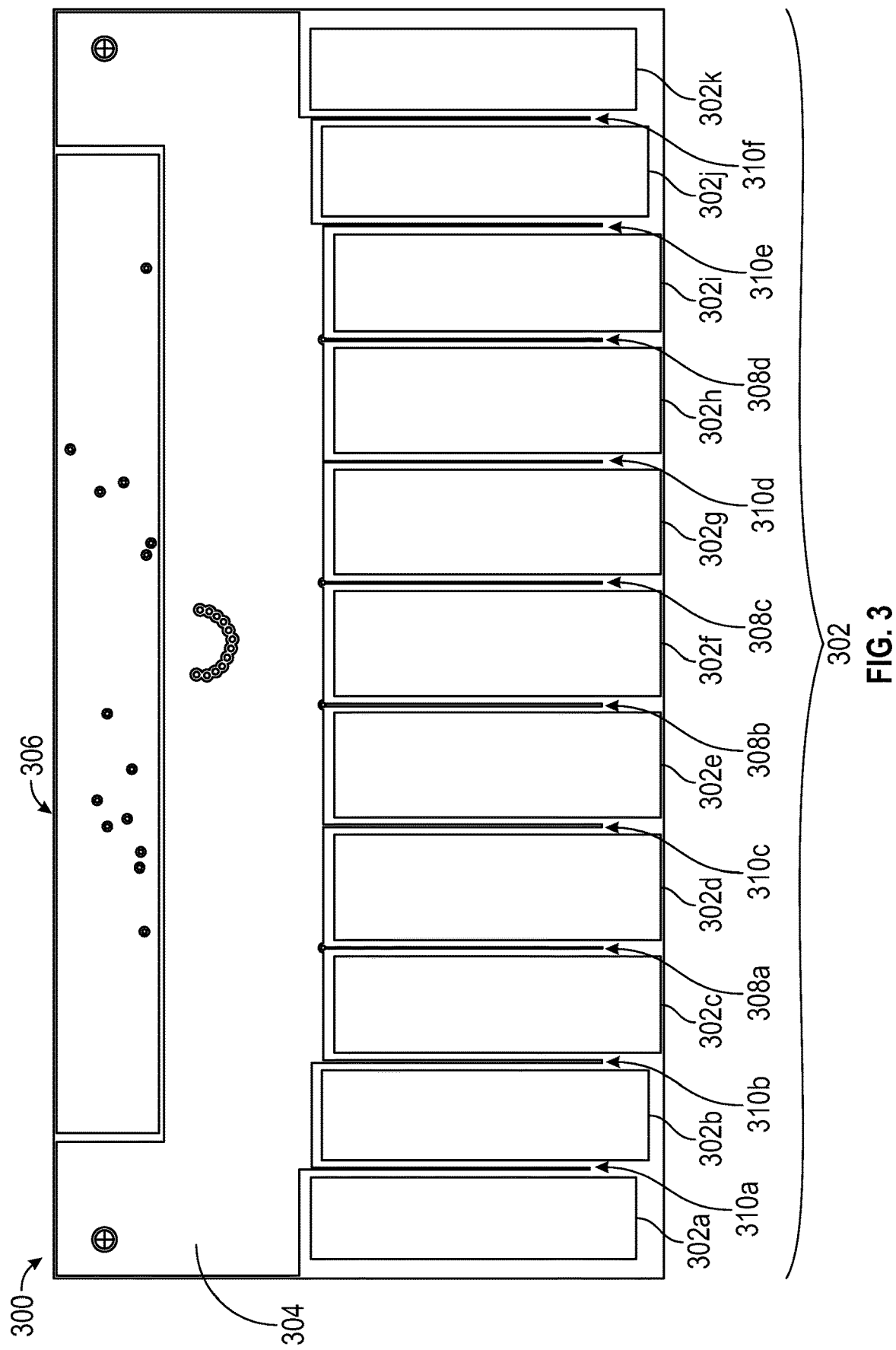
FIG. 3 shows the bottom layer of a circuit board of an obscured feature detector, according to another embodiment of the present disclosure.

FIG. 3 is a diagram of a bottom layer of circuit board 300, according to an embodiment of the present disclosure. The circuit board 300 may be integrated or otherwise included in an apparatus, such as the apparatus 100 of FIG. 2, which detects obscured features and obscured live wires. The circuit board 300 includes an obscured feature sensing element 302, a common plate 304 which is an active shield plate driven as active shield, and a single ground plate 306 which may be connected to circuit ground. The obscured feature sensing element 302 comprises a plurality of sensing pads 302a-302k that are used to sense presence of an obscured feature in the vicinity when scanning a surface. The sensing pads 302a-302k can be uniformly rectangular and primarily arranged in a generally linear fashion, and those pads 302a, 302b, 302j, 302k at the peripheral ends may be slightly adjusted to enhance uniformity of sensing at the peripheral ends. The sensing pads 302a-302k each perform a reading of a surface, then the readings are compared to recognize or otherwise identify which of the sensing pads 302a-302k sensed the highest reading(s) of the surface because the highest reading(s) may indicate a detection of an obscured feature. Sensing pads 302a, 302b, 302j, 302k that are positioned near the ends in an array of sensing pads 302 may respond to obscured features in a different manner, such as by responding with a disproportionately higher reading (due to producing electric fields that extend beyond the array of the sensing pads 302) when compared to responses of those located near the center of the array of sensing pads 302. This issue may be particularly evident in a linearly-arranged group of sensing pads when the obscured feature detector is moved from a thinner or less dense surface to a thicker or more dense surface. The sensing pads of the sensing element 302 that are positioned near the peripheral ends, for example sensing pads 302a, 302b, 302j, and 302k, are positioned in a way that the sensing pads 302a-302k form an arcuate pattern on the circuit board 300 as shown in FIG. 3. The circuit board 300 also includes active shield rods 310a and 310b positioned between the plurality of sensing pads 302a-302k of the sensing element 302. The active shield rods 310a-310f are electrically connected to the active shield 304 and may provide increased parallelism such that the sensing element 302 produces a more uniform response when detecting presence of an obscured feature, thereby increasing the ability of the apparatus 100 to sense obscured features.

For detecting obscured live wires behind a surface, the circuit board 300 further includes a wire sensing element comprising one or more wire sensing wires 308a-308d (collectively considered "wire sensing element 308"). Each of these one or more wires 308a-308d, when left floating, can be used for detection of live wires nearby. The wire sensing element 308 is coupled to a reference, such as the active shield 304 or the ground plate 306, when the apparatus is detecting obscured features instead of live wires. Each of the one or more wires 308a-308d of the wire sensing element 308 is located between the plurality of sensing element pads 302.

FIG. 4 is a top view of an obscured feature and live wire detection apparatus 400, according to another embodiment of the disclosure. Similar to the apparatus 100 of FIG. 1A, the apparatus 400 of FIG. 4 is used by scanning an opaque surface 401a, such as sheetrock, to sense and detect an obscured feature 401b and/or live wire 401c. The apparatus 400 includes a housing 402 that can house or otherwise support an indicator display 404 that can visually alert a user when the apparatus 400 detects an obscured feature or live wire. The indicator display 404 can indicate to a user the position of the obscured feature by displaying an inactive state 404a where an obscured feature is not sensed and by displaying an active state 404b where an obscured feature is detected. This feature may also be applicable to the illustrated embodiment of FIG. 1A. The indicator display 404 also includes a proximity indicator 404c that alerts the user when an obscured feature is sensed in the vicinity. The indicator display 404 can also include a live wire indicator 406 to alert the user when a live wire is sensed. In some embodiment, the live wire indicator 406 may display a variable electrical field strength of the obscured live wire 401c. The housing 400 further comprises a handle 408 and a battery cover 410 and is in a shape that supports sensing pads arranged in a square pattern on a circuit board. Sensing pads that sense for obscured features may be in a non-linear configuration, such as within a square area, for improved uniform response of the group of sensing pads.

Figure 5:
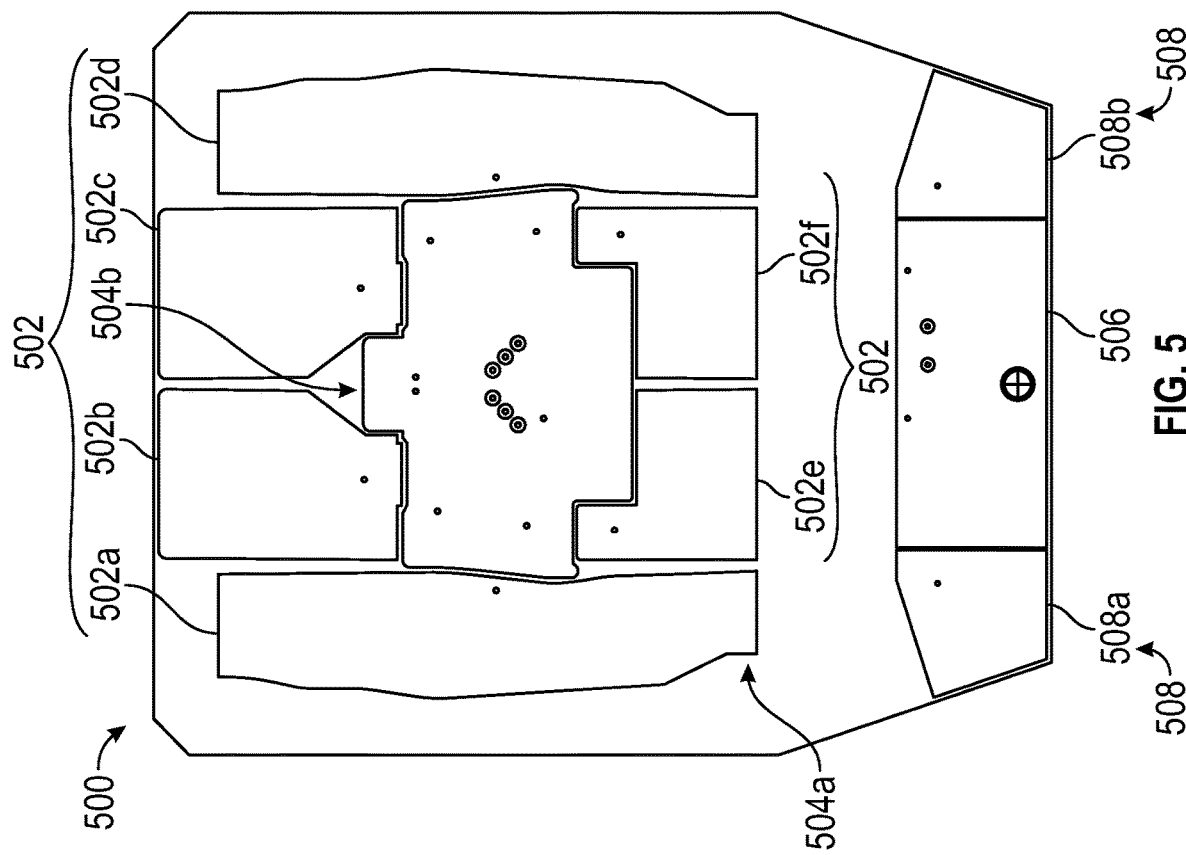
FIG. 5 shows the bottom layer of a circuit board of an obscured feature detector, according to another embodiment of the present disclosure.

FIG. 5 is a view of a bottom of a circuit board 500 of an obscured feature detector, according to another embodiment of the present disclosure. The circuit board 500 may be integrated or otherwise included in an apparatus that detects obscured features and live wires, such as the apparatus 400 of FIG. 4. The circuit board 500 includes a sensing element 502 that comprises a plurality of sensing pads 502a-502f arranged in a square pattern, square-like pattern, or other symmetrical arrangement. The circuit board 500 may be multi-layered. Sensing pads 502e and 502f may be in the bottom layer of circuit board 500 or rather may be in a different layer of the circuit board 500. The circuit board 500 also includes a common plate 504, which can be an active shield plate driven as an active shield. The active shield plate 504a may not be on the bottom layer of the circuit board 500, but on a layer above The active shield plate 504b may also be on a different layer of the circuit board 500 instead of the bottom layer shown in FIG. 5 and positioned in a center of the sensing element 502 when viewed from the bottom of circuit board 500. The circuit board 500 further includes a ground plate 506 which may be connected to circuit ground and located between two live wire sensing elements 508 shown as live wire sensing pads 508a and 508b positioned near an end or adjacent to the sensing element 502 on the circuit board 500 in FIG. 5. The live wire sensing elements 508 are either coupled to a reference (such as active shield of ground) when obscured feature detection is occurring or may be left floating to sense the presence of live wires.

Figure 6:
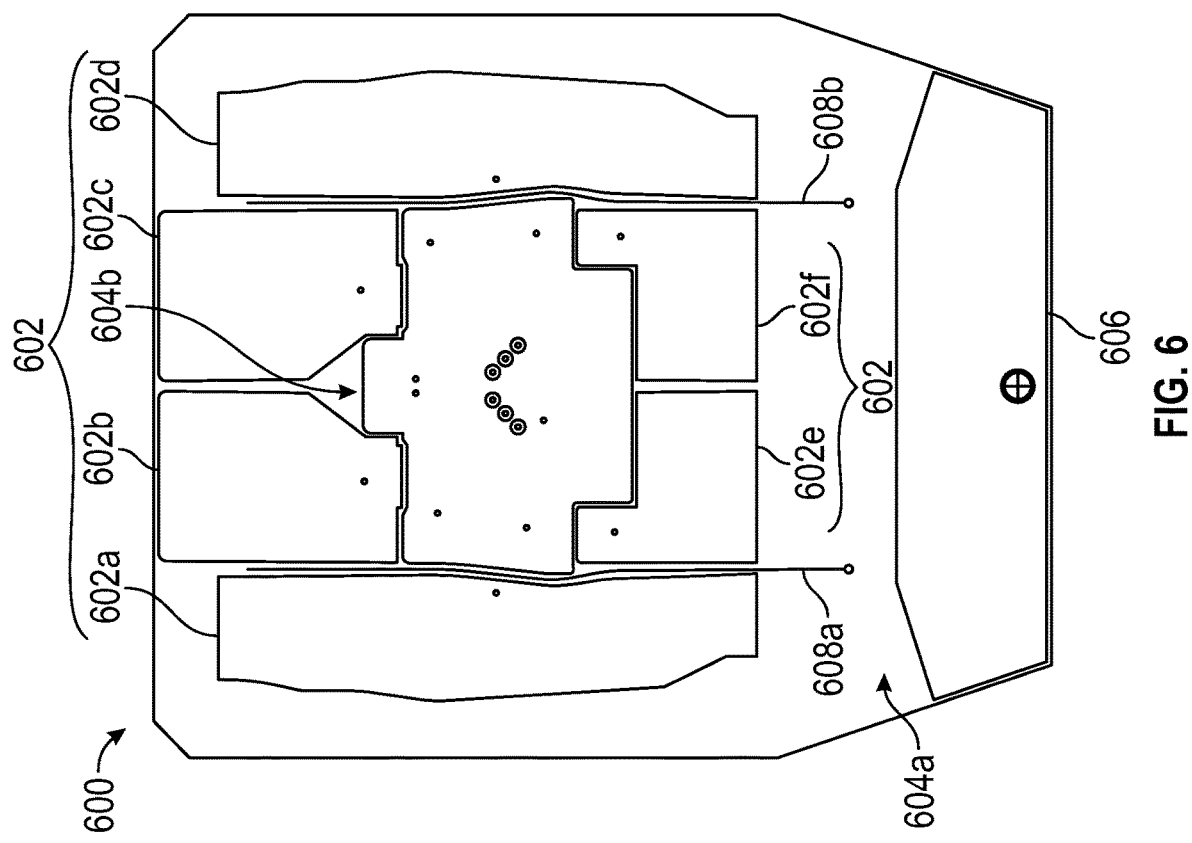
FIG. 6 shows the bottom layer of a circuit board of an obscured feature detector, according to another embodiment of the present disclosure.

FIG. 6 is a view of a bottom of a circuit board 600 of an obscured feature detector, according to another embodiment of the present disclosure. The circuit board 600 may be integrated or otherwise included an apparatus that detects obscured features and live wires, such as apparatus 400. The circuit board 600 includes a sensing element 602 comprising a plurality of sensing pads 602a-602f. The sensing pads 602a-602f are arranged in a square pattern. The circuit board 600 further comprises a common plate which is an active shield plate driven as active shield and comprises active shield plates 604a and 604b. The active shield plate 604a may not be on the bottom layer of circuit board 600, but on a layer above. Active shield plate 604b may also be on a different layer of circuit board 600 and positioned in the center of sensing element 602 when viewed from the bottom of circuit board 600. The circuit board 600 further includes a ground plate 606 near an end or adjacent to the sensing element 602 on circuit board 600 and may be connected to circuit ground. For live wire sensing, circuit board 600 includes a live wire sensing element which comprises a live wire sensing rod, two of which are shown as live wire sensing rods 608a and 608b in FIG. 6. The live wire sensing rods 608a, 608b are coupled to a reference (such as the active shield of ground) when obscured feature detection is occurring or may be left floating to sense the presence of live wires.

Figure 7:
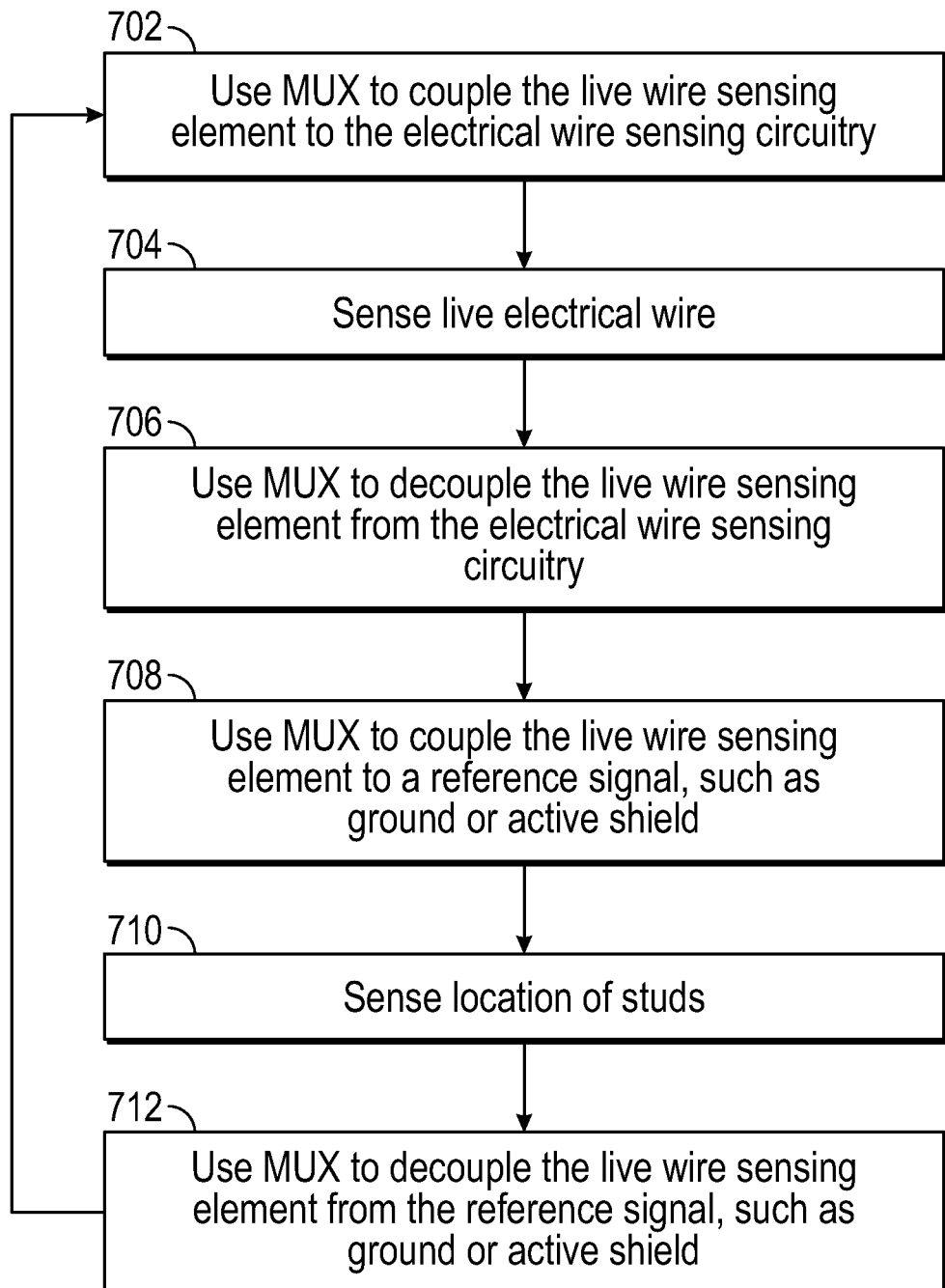
FIG. 7 is a flowchart that illustrates a flow of the sensing operation, according to one embodiment of the present disclosure.

FIG. 7 is a flow diagram of a sensing operation, according to an embodiment of the present disclosure. In this embodiment, a multiplexer (MUX) is used to couple 702 a live wire sensing element to either an electrical wire sensing circuitry or to a reference such as ground, an active shield, or another known reference signal. The sensing operation includes coupling a live wire sensing element to an electrical wire sensing circuitry using the MUX. An obscured live electrical wire is sensed 704 while the live wire sensing element is coupled to the electrical wire sensing circuitry. After completion of sensing live electrical wires, the MUX decouples 706 the live wire sensing element from electrical wire sensing circuitry and couples 708 the live wire sensing element to a reference such as ground or active shield. Location of an obscured feature is then sensed 710 with the live wire sensing element coupled to the reference. It may be advantageous to select a reference that is similar to its surroundings, for example, if the live wire sensing element is surrounded by ground, it may be advantageous to make the reference be ground. Such selection can make sensor pads have a more similar response and increase the ability to sense obscured features accurately. Once the sensing of obscured features has been completed, the MUX can be switched to decouple 712 the live wire sensing from the reference and back to coupling 702 the electrical wire sensing circuitry to the live wire sensing element. This interleaving of the live wire sensing element between the electrical wire sensing circuitry and a reference is repeated during operation to sense live electrical wires and obscured features.

Figure 8:
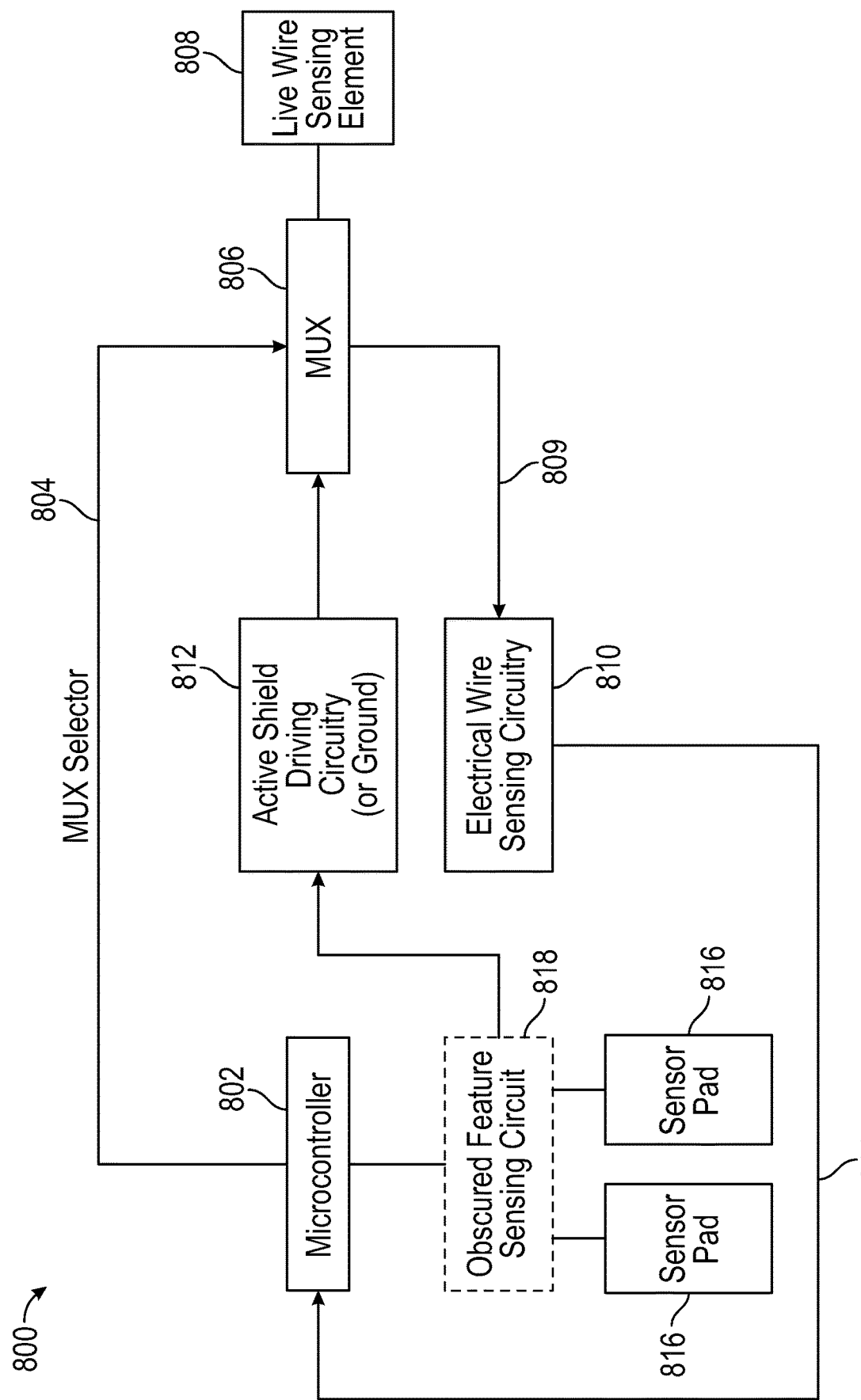
FIG. 8 is a block diagram of circuit, according to one embodiment of the present disclosure, that switches the live wire sensing elements between being connected to a reference, for obscured feature sensing, and being connected to sensing circuitry for sensing the presence of live wires.

FIG. 8 is a block diagram of a circuit 800 of an obscured feature detector that detects both obscured features and live wires, according to one embodiment of the present disclosure. The circuit 800 switches a live wire sensing element 808 between being connected to a reference for obscured feature sensing and being connected to sensing circuitry for sensing the presence of live wires. In this circuit 800, a microcontroller 802 provides a MUX Selector signal 804 to drive a MUX 806, which is to couple a live wire sensing element 808 to an electrical wire sensing circuitry 810. The MUX Selector signal 804 may be responsible for selecting if the live wire sensing element 808 is coupled to a reference, in this case an active shield driving circuitry 812 (or ground) or is coupled to the electrical wire sensing circuitry 810. A signal 809 is provided via the MUX to the electrical wire sensing circuitry 810. A signal 814 from the electrical wire sensing circuitry 810 is sent to the microcontroller 802. In one embodiment, the electrical wire sensing circuitry 810 in effect amplifies the signal 809, which is simply the MUX 806 passing the signal on the live wire sensing element 808.

The microcontroller 802 is also coupled with obscured feature sensing pads 816 via an obscured feature sensing circuit 818. The obscured feature sensing circuit 818 communicates with a reference circuitry, such as an active shield driving circuitry or ground 812, which is connected to the MUX 806 that can couple the live wire sensing element 808 either to the electrical wire sensing circuitry 810 or the reference 812.

In the diagram of FIG. 8, the wires (or lines) shown without arrows are bi-directional, while the wires (or lines) shown with only on arrow are unidirectional.

Figure 9:
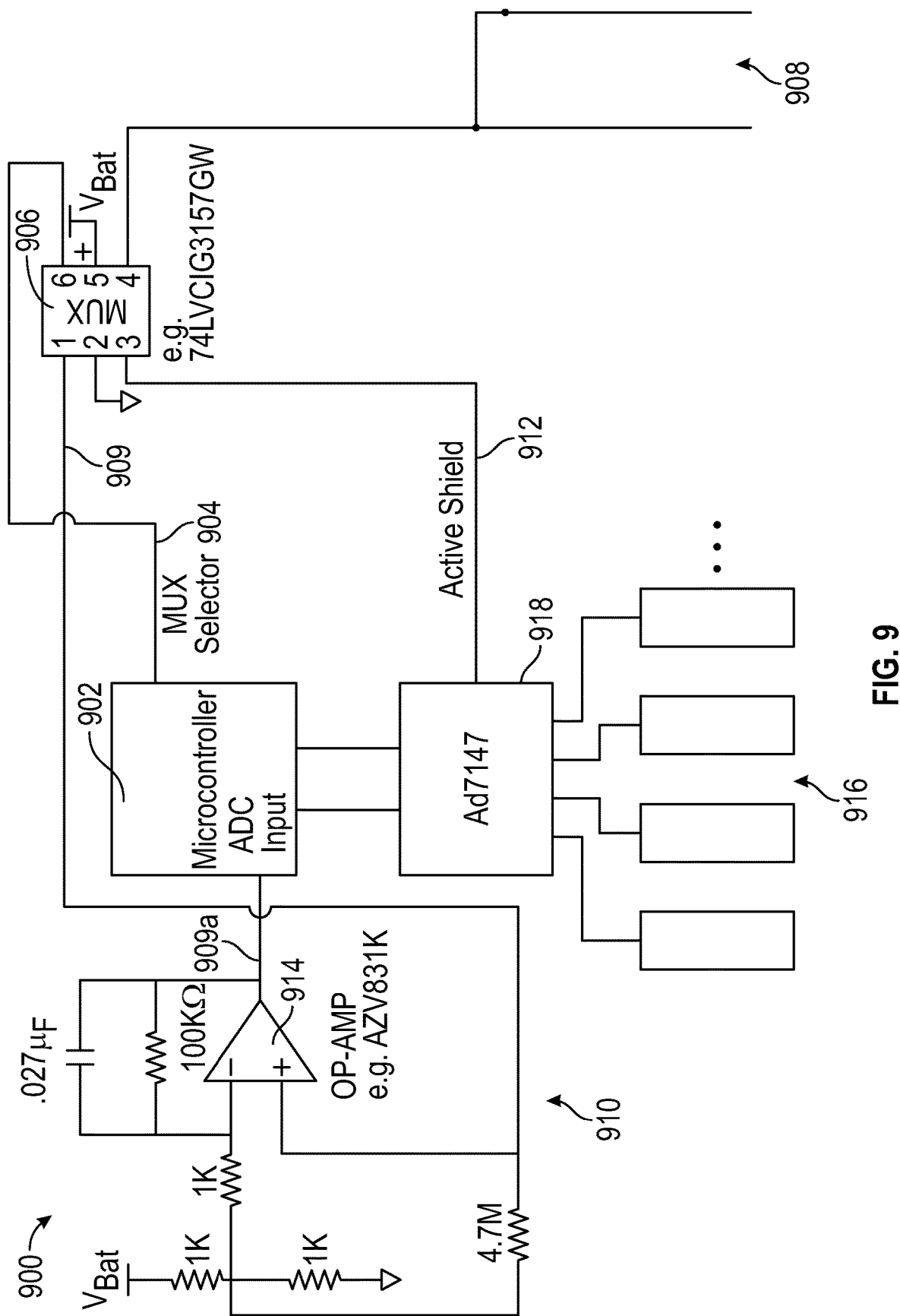
FIG. 9 is a more detailed diagram of the circuit of FIG. 8.

FIG. 9 is a more detailed circuit diagram of a circuit 900 of an obscured feature detector that switches a live wire sensing element 908 between being connected to a reference for obscured feature sensing and being connected to sensing circuitry for sensing the presence of live wires, according to one embodiment of the present disclosure. For example, the circuit 900 could be identical or similar to the circuit 800 of FIG. 8.

A microcontroller 902 drives a MUX selector signal 904, which is digital output provided to a MUX 906 that can couple a live wire sensing element 908 either to electrical wire sensing circuitry 910 or a reference such as ground or active shield 912. An example of a microcontroller is a STM32G3157GW.

The MUX 906 can have six ports, ports 1-6. The live wire sensing element 908 may be one or more live wire sensing rods or live wire sensing pads connected to the MUX 906, for example to port 4 of the MUX 906. An example of a MUX 906 is a 74LVCIG3157GW.

The microcontroller 902 is fed signal 909a, which is an amplified form of the signal 909 from the live wire sensing element 908, as amplified by an operational amplifier (op-amp) 914. The op-amp 914 and associated resistors and capacitors can function as an amplifier. For example, a signal 909 from the MUX 906 can be provided through MUX port 1 to op-amp 914, which produces the amplified signal 909a that is passed on to the microcontroller 902. An example of an op-amp 914 is a AZV831K.

The microcontroller 902 can convert the signal from the live wire sensing element 908 to a digital signal via an analog to digital converter (ADC). The electrical wire sensing circuitry may comprise an analog to digital converter.

The microcontroller 902 is also connected to obscured feature sensing element 916 via obscured feature sensing circuitry 918. An example of the obscured feature sensing circuitry 918 shown in FIG. 9 is a AD7147. There may be numerous obscured feature sensing pads as an obscured feature sensing element 916. The obscured feature sensing circuitry 918 is linked to active shield driving circuitry 912 then to the MUX 906, for example to MUX port 3. Another example of an obscured feature sensing circuit 918 is AD7147PAC PZ-RL. In FIG. 9, the AD7147 obscured feature sensing circuitry 918 performs the obscured feature sensing and communicates directly with the microcontroller 902. The remaining MUX ports 5 and 2 may be used to supply battery voltage and common ground, respectively. Additional elements not shown in FIG. 9 and/or otherwise omitted from this discussion can include powers and grounds, display circuitry, and other signals as these are already known in the art or otherwise understood by one skilled in the art.

Figure 10:
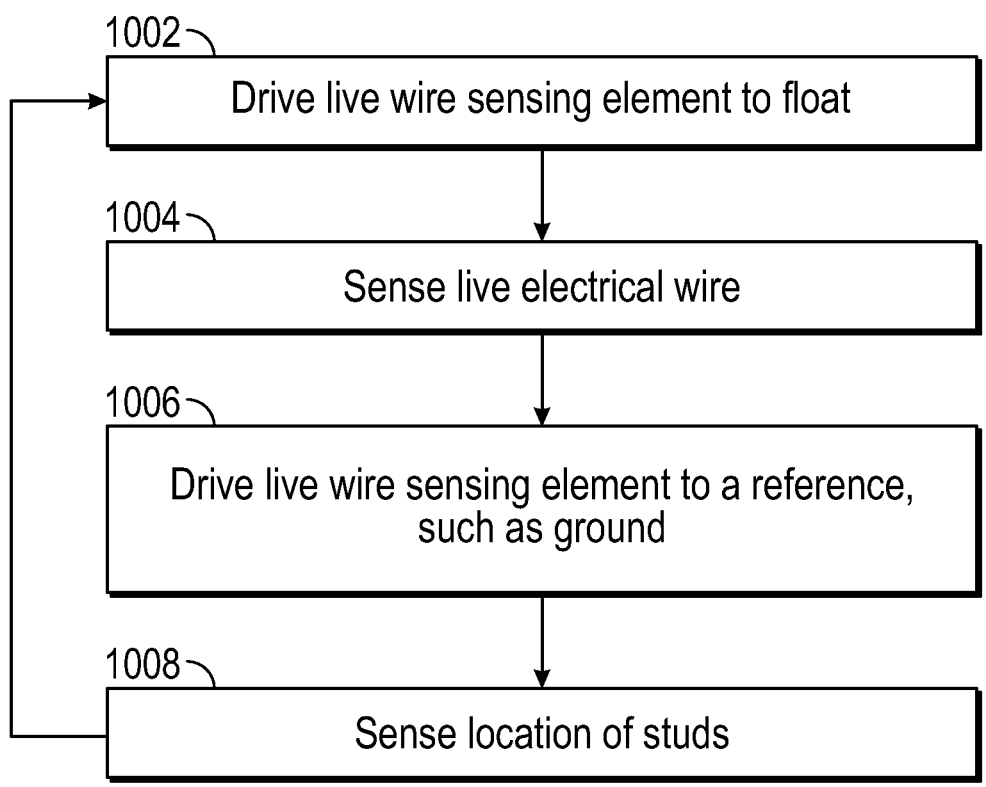
FIG. 10 is a flowchart that illustrates a flow of the sensing operation, according to one embodiment of the present disclosure.

FIG. 10 is a flow diagram of a sensing operation, according to another embodiment of the present disclosure. In this embodiment, a live wire sensing element is driven 1002 to float. An obscured live electrical wire is sensed 1004 while the live wire sensing element is floating. After the obscured live electrical wire is sensed 1004, the live wire sensing element is driven 1006 to a reference such as ground. Location of an obscured feature is then sensed 1008 with the live wire sensing element coupled to the reference. After completion of the sensing 1008 of obscured features, the live wire sensing element may again be driven 1002 to a floating state. This alternating of the live wire sensing element being driven alternately between a floating state and a reference is repeated to sense 1004 live electrical wires and to sense 1008 obscured features during sensing operation. A live wire sensing element may be driven 1002, 1006 by a controller, such as a microcontroller. A controller may be configured to intermittently drive the electrical wire sensing element to a driven value. For example, the live wire sensing element may be intermittently driven to a ground reference value, driven as an active shield, or driven to a value that matches the value on the sensor pads.

Figure 11:
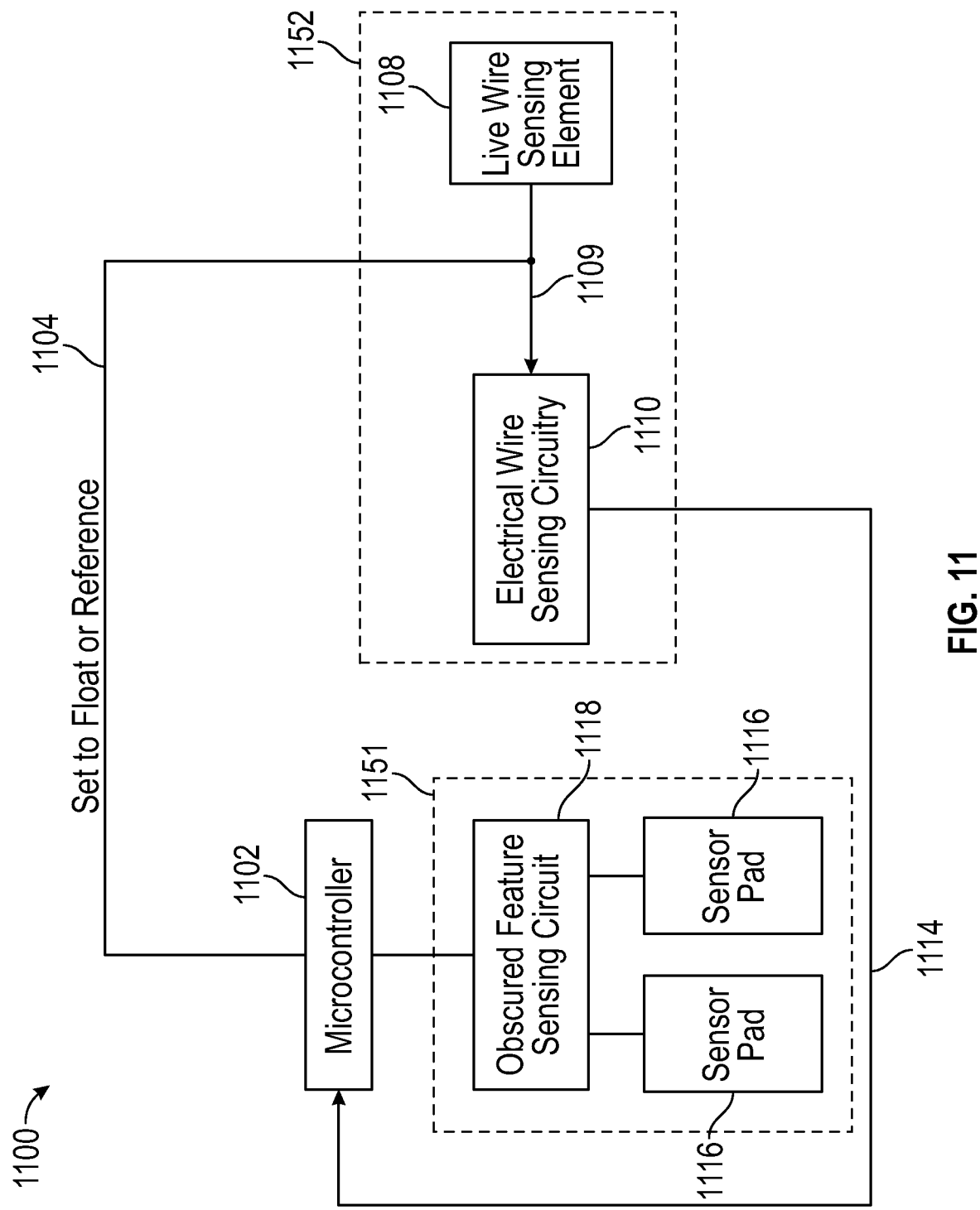
FIG. 11 is a block diagram of circuit, according to one embodiment of the present disclosure, that switches the live wire sensing elements between being connected to a reference, for obscured feature sensing, and being connected to sensing circuitry for sensing the presence of live wires.

FIG. 11 is a block diagram of a circuit 1100 of an obscured feature detector that detects both obscured features and live wires, according to one embodiment of the present disclosure. The circuit 1100 of FIG. 11 includes both obscured feature detection circuitry 1151 (e.g., an obscured feature detection component that may include obscured feature sensing circuitry 1118 and one or more sensor pads 1116) and live wire detection circuitry 1152 (e.g., a live wire detection component that may include a live wire sensing element 1108 and electrical wire sensing circuitry 1110). The circuit 1100 switches a live wire sensing element 1108 between a state of floating (for sensing the presence of live wires) and a state of being connected to a reference (for sensing obscured features). A microcontroller 1102 is included in the circuit 1100 which provides an output signal 1104 to drive the live wire sensing element 1108 either to float or to a reference. The wire sensing element 1108 also is connected to live wire sensing circuitry 1110. In a floating state of the live wire sensing element 1108, a signal 1109 is provided to the electrical wire sensing circuitry 1110. A signal 1114 from electrical wire sensing circuitry 1110 is sent to the microcontroller 1102. In one embodiment, the electrical wire sensing circuitry 1110 in effect amplifies the signal 1109. When the live wire sensing element 1108 is driven to a reference, such as ground, the signal 1114 is sent to microcontroller 1102 to in effect couple with and otherwise activate reading the obscured feature sensing pads 1116 via an obscured feature sensing circuit 1118.

Figure 12:
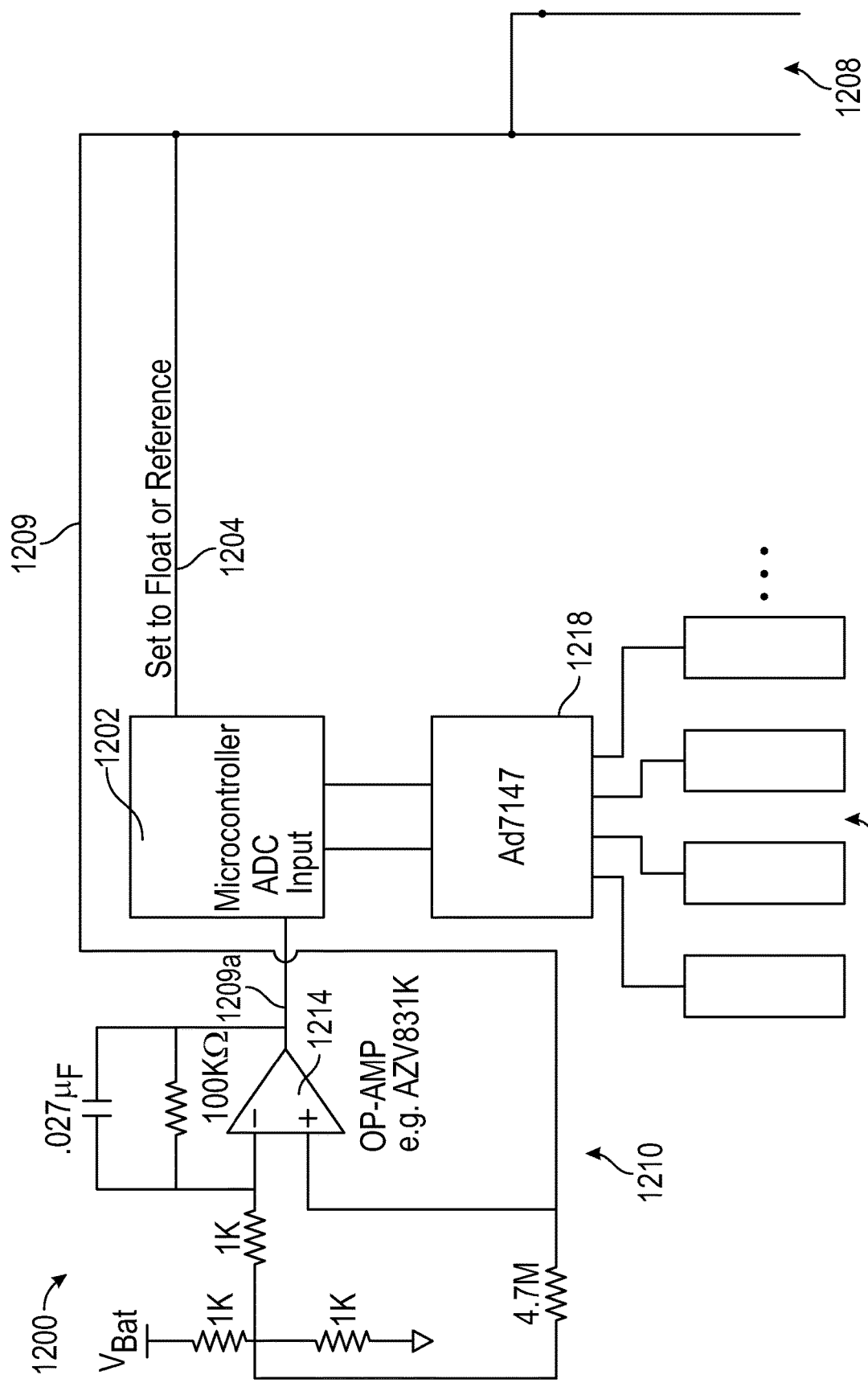
FIG. 12 is a more detailed diagram of the circuit of FIG. 11.

FIG. 12 is a more detailed circuit diagram of a circuit 1200 of an obscured feature detector that switches a live wire sensing element 1208 between being connected to a reference for obscured feature sensing and being connected to sensing circuitry for sensing the presence of live wires, according to one embodiment of the present disclosure. For example, the circuit 1200 could be identical or similar to the circuit 1100 of FIG. 11. The live wire sensing element 1208 may comprise at least a portion of a common plate, such as an active shield plate described above with reference to FIGS. 2-6.

A microcontroller 1202 drives a signal 1204 that can couple a live wire sensing element 1208 to electrical wire sensing circuitry 1210. An example of a microcontroller is a STM32G3157GW. The signal 1204 is set to float or to a reference.

The microcontroller 1202 is fed a signal 1209a that is an amplified form of a signal 1209 from the live wire sensing element 1208, as amplified by an operational amplifier (op-amp) 1214. The op-amp and associated resistors and capacitors can function as an amplifier. For example, a signal 1209 to op-amp 1214, which produces the amplified signal 1209a, is passed on to the microcontroller 1202. An example of an op-amp 1214 is a AZV831K.

The electrical wire sensing circuitry 1210 may comprise an analog to digital converter. It may be that the microcontroller 1202 can convert the signal from the live wire sensing element 1208 to a digital signal via an analog to digital converter (ADC).

The microcontroller 1202 is also connected to an obscured feature sensing element 1216 via obscured feature sensing circuitry 1218. An example of the obscured feature sensing circuitry 1218 shown in FIG. 12 is a AD7147. There may be numerous obscured feature sensing pads as an obscured feature sensing element 1216. Another example of an obscured feature sensing circuit 1218 is AD7147PAC PZ-RL. In FIG. 12, the AD7147 obscured feature sensing circuitry 1218 performs the obscured feature sensing and communicates directly with the microcontroller 1202. Additional elements not shown in FIG. 12 and/or otherwise omitted from this discussion can include powers and grounds, display circuitry, and other signals as these are already known in the art or otherwise understood by one skilled in the art.

In some embodiments the range of the electrical field strength indicator is fixed. In other words, the range of the electrical field strength indicator is set to permanent values at the factory.

In some embodiments the electrical strength display has an auto-corrector that is helpful to automatically scale the range of the display. The auto-corrector may be used to adjust range in the event that a new reading would otherwise map to a location beyond the range of the electrical strength display. In other words, if a new electrical strength reading were to be a value that was beyond the range of the display, then the range of the display would be adjusted, so that the new reading would then be within the range of the display.

Examples

The following provide one or more examples of embodiments of the present disclosure.

Example 1. An apparatus for detecting obscured features and obscured electrical wires behind a surface, the apparatus comprising: an obscured feature sensing element to sense an obscured feature; obscured feature sensing circuitry operatively coupled to the obscured feature sensing element, the obscured feature sensing circuitry configured to measure a sensor reading on the obscured feature sensing element; an obscured feature indicator to display to a user that an obscured feature has been detected behind a surface, based on the sensor reading; a live wire sensing element to detect an obscured live electrical wire; electrical wire sensing circuitry operatively coupled to the live wire sensing element, the electrical wire sensing circuitry to receive signals originating from the live wire sensing element; and a live wire indicator to display to the user a variable electrical field strength of a detected live electrical wire, based on the signals originating from the live wire sensing element, wherein the obscured feature indicator and the live wire indicator are concurrently displayed to the user.

Example 2. The apparatus of example 1, wherein the live wire indicator displays a visual indicia that is variable based on the variable electrical field strength of the detected live electrical wire.

Example 3. The apparatus of example 1, wherein the live wire indicator comprises a plurality of display segments to incrementally display to the user the variable electrical field strength of the detected live electrical wire.

Example 4. The apparatus of example 3, wherein the plurality of display segments includes illuminating elements, which are to illuminate to display to the user the variable electrical field strength of the detected live electrical wire.

Example 5. The apparatus of example 4, wherein a larger number of illuminated illuminating elements indicate a stronger electrical field strength of the detected live electrical wire than a smaller number of illuminated illuminating elements.

Example 6. The apparatus of example 1, wherein the live wire indicator displays a number on a numerical scale to display the variable electrical field strength of the detected live electrical wire.

Example 7. The apparatus of example 1, wherein the live wire indicator displays numerical units of the variable electrical field strength of the detected live electrical wire.

Example 8. The apparatus of example 1, wherein the obscured feature indicator displays a location of the obscured feature.

Example 9. The apparatus of example 1, wherein the obscured feature indicator comprises a plurality of illuminating elements that extend laterally along a length of the apparatus.

Example 10. The apparatus of example 9, wherein a corresponding illuminating element of the plurality of illuminating elements illuminates when the corresponding illuminating elements aligns with the obscured feature.

Example 11. The apparatus of example 10, wherein multiple corresponding illuminating elements illuminate when the multiple corresponding illuminating elements align with the obscured feature to display a width of the obscured feature.

Example 12. An apparatus for detecting obscured features and obscured electrical wires, the apparatus comprising: an obscured feature indicator to display to a user that an obscured feature has been detected behind a surface; and a live wire indicator to display to the user a variable electrical field strength of an obscured live electrical wire, wherein the obscured feature indicator and the live wire indicator are concurrently displayed to the user.

Example 13. The apparatus of example 12, wherein the live wire indicator displays a visual indicia that varies based on the electrical field strength of the detected live electrical wire.

Example 14. The apparatus of example 12, wherein the live wire indicator comprises a plurality of display segments that are incrementally actuatable to display to the user the electrical field strength of the detected live electrical wire.

Example 15. The apparatus of example 14, wherein the plurality of display segments includes illuminating elements that illuminate to display to the user the electrical field strength of the detected live electrical wire.

Example 16. The apparatus of example 15, wherein a larger number of illuminated illuminating elements indicate a stronger electrical field strength of the detected live electrical wire than a smaller number of illuminated illuminating elements.

Example 17. The apparatus of example 12, wherein the live wire indicator displays a number on a numerical scale to display to the user the electrical field strength of the detected live electrical element.

Example 18. The apparatus of example 12, wherein the live wire indicator displays numerical units of the electrical field strength of the detected live electrical element.

Example 19. An apparatus for detecting obscured electrical wires behind a surface, the apparatus comprising: a live wire sensing element to detect an obscured live electrical wire; electrical wire sensing circuitry operatively coupled to the live wire sensing element, the electrical wire sensing circuitry to receive readings of the live wire sensing element; and a live wire indicator to display to a user an indication of an electrical field strength of the obscured live electrical wire, based on the readings of the live wire sensing element.

Example 20. An apparatus for detecting obscured features and electric field strength wherein the live wire indicator has a display range and wherein an auto-corrector is used to adjust the display range of the live wire indicator in the event that a new reading is beyond the display range of the live wire indicator.

It will be obvious to those having skill in the art that many changes may be made to the details of the above-described embodiments without departing from the underlying principles of the invention. The scope of the present invention should, therefore, be determined only by the following claims.

The invention claimed is:

1. An apparatus for detecting obscured features and obscured electrical wires behind a surface, the apparatus comprising:

an obscured feature sensing element to sense an obscured feature;
obscured feature sensing circuitry operatively coupled to the obscured feature sensing element, the obscured feature sensing circuitry configured to measure a sensor reading on the obscured feature sensing element;
an obscured feature indicator to display to a user that an obscured feature has been detected behind a surface, based on the sensor reading;
a live wire sensing element to detect an obscured live electrical wire;
electrical wire sensing circuitry operatively coupled to the live wire sensing element, the electrical wire sensing circuitry to receive signals originating from the live wire sensing element;
a live wire indicator to display to the user a variable electrical field strength of a detected live electrical wire, based on the signals originating from the live wire sensing element; and
an auto-corrector to adjust the display range of the live wire indicator in the event that a new reading is beyond the display range of the live wire indicator,
wherein the obscured feature indicator and the live wire indicator are concurrently displayed to the user.

2. The apparatus of claim 1, wherein the live wire indicator displays a visual indicia that is variable based on the variable electrical field strength of the detected live electrical wire.

3. The apparatus of claim 1, wherein the live wire indicator comprises a plurality of display segments to incrementally display to the user the variable electrical field strength of the detected live electrical wire.

4. The apparatus of claim 3, wherein the plurality of display segments includes illuminating elements, which are to illuminate to display to the user the variable electrical field strength of the detected live electrical wire.

5. The apparatus of claim 4, wherein a larger number of illuminated illuminating elements indicate a stronger electrical field strength of the detected live electrical wire than a smaller number of illuminated illuminating elements.

6. The apparatus of claim 1, wherein the live wire indicator displays a number on a numerical scale to display the variable electrical field strength of the detected live electrical wire.

7. The apparatus of claim 1, wherein the live wire indicator displays numerical units of the variable electrical field strength of the detected live electrical wire.

8. The apparatus of claim 1, wherein the obscured feature indicator displays a location of the obscured feature.

9. The apparatus of claim 1, wherein the obscured feature indicator comprises a plurality of illuminating elements that extend laterally along a length of the apparatus.

10. The apparatus of claim 9, wherein a corresponding illuminating element of the plurality of illuminating elements illuminates when the corresponding illuminating elements aligns with the obscured feature.

11. The apparatus of claim 10, wherein multiple corresponding illuminating elements illuminate when the multiple corresponding illuminating elements align with the obscured feature to display a width of the obscured feature.

12. An apparatus for detecting obscured features and obscured electrical wires, the apparatus comprising:

an obscured feature indicator to display to a user that an obscured feature has been detected behind a surface;
a live wire indicator to display to the user a variable electrical field strength of an obscured live electrical wire, wherein the live wire indicator has a display range; and
an auto-corrector to adjust the display range of the live wire indicator in the event that a new reading is beyond the display range of the live wire indicator,
wherein the obscured feature indicator and the live wire indicator are concurrently displayed to the user.

13. The apparatus of claim 12, wherein the live wire indicator displays a visual indicia that varies based on the electrical field strength of the detected live electrical wire.

14. The apparatus of claim 12, wherein the live wire indicator comprises a plurality of display segments that are incrementally actuatable to display to the user the electrical field strength of the detected live electrical wire.

15. The apparatus of claim 14, wherein the plurality of display segments includes illuminating elements that illuminate to display to the user the electrical field strength of the detected live electrical wire.

16. The apparatus of claim 15, wherein a larger number of illuminated illuminating elements indicate a stronger electrical field strength of the detected live electrical wire than a smaller number of illuminated illuminating elements.

17. The apparatus of claim 12, wherein the live wire indicator displays a number on a numerical scale to display to the user the electrical field strength of the detected live electrical element.

18. The apparatus of claim 12, wherein the live wire indicator displays numerical units of the electrical field strength of the detected live electrical element.

19. An apparatus for detecting obscured features and obscured electrical wires behind a surface, the apparatus comprising:

an obscured feature sensing element to sense an obscured feature;
obscured feature sensing circuitry operatively coupled to the obscured feature sensing element, the obscured feature sensing circuitry configured to measure a sensor reading on the obscured feature sensing element;
an obscured feature indicator to display to a user that an obscured feature has been detected behind a surface, based on the sensor reading;
a live wire sensing element to detect an obscured live electrical wire;
electrical wire sensing circuitry operatively coupled to the live wire sensing element, the electrical wire sensing circuitry to receive signals originating from the live wire sensing element; and
a live wire indicator to display to the user a variable electrical field strength of a detected live electrical wire, based on the signals originating from the live wire sensing element,
wherein the obscured feature indicator and the live wire indicator are concurrently displayed to the user, wherein the live wire sensing element is decoupled from the electrical wire sensing circuitry before the obscured feature sensing circuitry is operatively coupled to the obscured feature sensing element.

* * * * *